United States Patent [19]

Maida

[11] 3,934,178

[45] Jan. 20, 1976

[54] DEVICE FOR GENERATING A SIGNAL FOR A PREDETERMINED INTERVAL AFTER A POWER SWITCH IS OPENED

[75] Inventor: Osamu Maida, Tokyo, Japan

[73] Assignee: Nippon Kogaku K.K., Tokyo, Japan

[22] Filed: Apr. 23, 1974

[21] Appl. No.: 463,246

[30] Foreign Application Priority Data
May 1, 1973 Japan.............................. 48-47586
May 1, 1973 Japan.............................. 48-47587

[52] U.S. Cl............................ 317/141 S; 317/155.5
[51] Int. Cl.² ....................................... H01H 47/18
[58] Field of Search......... 317/141 R, 141 S, 142 R, 317/146, 137, 139, 150, 155.5; 307/293, 141, 141.4

[56] References Cited
UNITED STATES PATENTS

| | | | |
|---|---|---|---|
| 3,144,568 | 8/1964 | Silliman et al.................. | 317/141 S |
| 3,205,411 | 9/1965 | Culbertson ...................... | 317/141 S |
| 3,282,631 | 11/1966 | Mosinski.......................... | 317/141 S |
| 3,683,301 | 8/1972 | Boley et al....................... | 317/141 S |
| 3,732,468 | 5/1973 | Witt et al......................... | 317/141 S |

*Primary Examiner*—J. D. Miller
*Assistant Examiner*—Harry E. Moose, Jr.
*Attorney, Agent, or Firm*—Fitzpatrick, Cella, Harper & Scinto

[57] ABSTRACT

For the purpose of assuring the holding latching relay in a nonconductive situation whenever an operator turns off a power switch, this invention provides a circuit for generating a signal for a predetermined time interval after the power switch is opened. The circuit includes a power switch, a capacitor charge only when the power switch is closed, a transistor and means for applying a terminal voltage of the capacitor to the transistor in order to render it conductive when the power switch is opened. A rectifier may be provided to prevent a reverse current and the capacitor maybe charged through the rectifier.

6 Claims, 10 Drawing Figures

DEVICE FOR GENERATING A SIGNAL FOR A PREDETERMINED INTERVAL AFTER A POWER SWITCH IS OPENED

BACKGROUND OF THE INVENTION

1. Field of the Invention

This invention relates to a circuit for generating a signal for a predetermined time interval after a power switch is opened.

2. Description of the Prior Art

In the case of a conventional latching relay, for example, a contact is closed when a conduction signal is supplied and the contact is kept closed even after the conduction signal is cut off; and the contact is opened if a nonconduction signal is subsequently supplied and the contact is kept in the same situation until the next conduction signal is supplied. In such a case, if a power switch of a signal generating device is opened after a conduction signal is applied, the contact of the latching relay is kept closed since a nonconduction signal will not be supplied thereafter.

However, it is sometimes very desirable that the latching relay is maintained in a nonconductive situation whenever an operator turns off the power switch.

Further, in the case of a RC integrating circuit, for another example, when a time duration required to raise a terminal voltage of an integrating capacitor up to a predetermined value from its initial state where said terminal voltage of the integrating capacitor is zero is measured and its charging time is used for a particular purpose, a certain amount of electric charge is held on the capacitor if the power supply of the RC integrating circuit is interrupted before the terminal voltage across two terminals of the capacitor reaches the predetermined value.

When the power switch is closed again after a period of time, a disadvantage is noted in that the time required to charge up the capacitor to the predetermined voltage is shorter than normal value because the capacitor retains some residual charge before it is charged again. Thus, it is necessary to bring down the capacitor terminal voltage to zero (initial condition) whenever the power source is switched off.

SUMMARY OF THE INVENTION

Accordingly, I have conceived the present invention whereby I am able to provide an improved device overcoming the disadvantages of the prior art and to generate a signal for a predetermined time interval after the power switch is turned off.

According to my invention, the device or circuit comprises a power switch, a capacitor charged only when the power switch is closed, a transistor and means for applying a terminal voltage of the capacitor to the transistor in order to make the transistor conductive when the power switch is opened.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception upon which this disclosure is based may readily be utilized as a basis for the designing of other structures for carrying out the several purposes of the invention. It is important, therefore, that the claims be regarded as including such equivalent construction as do not depart from the spirit and scope of the invention.

BRIEF DESCRIPTION OF THE DRAWINGS

Specific embodiments of the invention have been chosen for purposes of illustration and description, and are shown in the accompanying drawings forming a part of the specification wherein.

DESCRIPTION OF THE PREFERRED EMBODIMENTS

Figure 1:
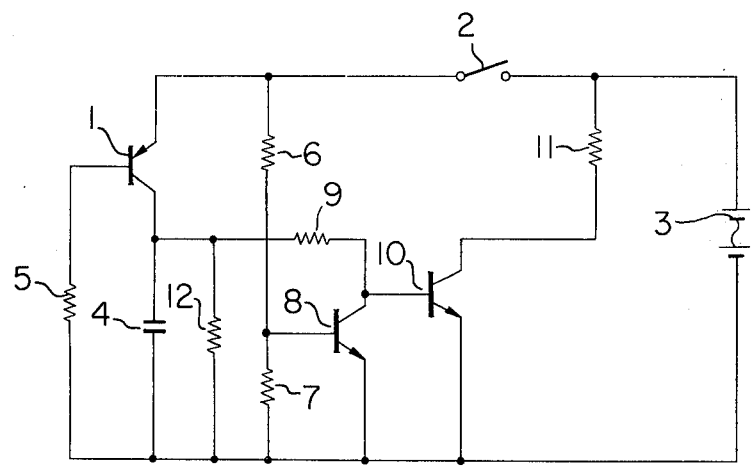
FIG. 1 is an electric circuit diagram of the first illustrative embodiment of the invention.

Referring to FIG. 1, the emitter of a transistor 1 is connected to a positive terminal of a power source 3 in series with a power switch 2, the collector electrode of the transistor 1 is connected to a negative terminal of the power source 3 through a capacitor 4, and the base electrode is connected to the negative terminal of the power source 3 in series with a resistor 5. Two series connected resistors 6 and 7 are connected to the power source 3 in series with the power switch 2.

The base of a transistor 8 is connected at a junction point of resistors 6 and 7, the collector electrode of the transistor 8 is connected at a junction point of the collector of the transistor 1 and the capacitor 4 through a resistor 9, and the emitter of the transistor 8 is connected to the negative terminal of the power source 3.

Resistance values of both resistors 6 and 7 are selected so as to render the transistor 8 conductive when the power switch 2 is closed.

The base of a transistor 10 is connected at a juncture point of the collector of the transistor 8 and the resistor 9, the emitter of the transistor 10 is connected to the negative terminal of the power source 3, and the collector of the transistor 10 is connected to the positive terminal of the power source 3 through a resistor 11. A resistor 12 which has a high resistance is connected in shunt with the capacitor 4.

The circuit explained above operates as follows:

Both of the transistors 1 and 8 become conductive as the power switch 2 is closed. On the other hand, the transistor 10 is nonconductive because its emitter and base are substantially short circuited by the conducting transistor 8. The capacitor 4 is charged as the power switch 2 is closed.

When the switch 2 is opened after a period of time, both of the transistors 1 and 8 are turned off. On the contrary, the transistor 10 becomes conductive because the voltage across two terminals of the capacitor 4, which has been charged by this time, is applied between the base and the emitter of the transistor 10.

In other words, the transistor 1 is turned off upon opening of the power switch 2, therefore charges on the capacitor 4 cannot flow through the circuit of the resistors 6 and 7, but the voltage across the two terminals of the capacitor 4 is applied between the base and emitter of the transistor 10.

Then the charges on the capacitor 4 are consumed as a current flow in the circuit of the resistor 9 and the base emitter junction of the transistor 10. A predetermined time later, when the voltage across the terminals of the capacitor 4 is less than a threshold voltage of the transistor 10, the transistor 10 automatically turns into the nonconductive state. As a result, all of the circuit elements are brought back to their initial situation or nonoperative condition.

Thus, it will be seen that the aforementioned circuit generates a signal which causes conduction of the transistor 10 for a predetermined constant time interval when the power switch 2 is turned off.

The resistor 12 serves to prevent the prolongation of the time required to discharge the capacitor 4 by an increase in an input impedance as the terminal voltage of the capacitor 4 approaches the threshold voltage of the transistor 10 when the charge on the capacitor 4 is discharged.

The predetermined time interval can be set optionally by selecting the resistance values of the resistors 9 and 12 and the capacity of the capacitor 4.

Figure 2:
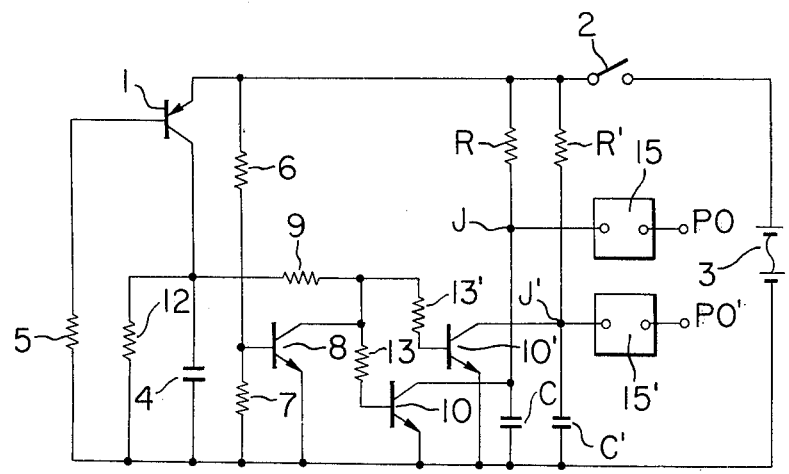
FIG. 2 is an electric circuit diagram of a RC integrating circuit provided with the first embodiment of the present invention.

Referring now to FIG. 2, there is shown a circuit diagram including the first embodiment of the invention wherein the time required to raise the terminal voltage of a capacitor in a RC integrating circuit from zero to a predetermined value in the initial state is detected, and its charging time is used for a given purpose.

Two RC integrating circuits respectively comprise resistors R, R' and capacitors C, C' in series relation, are connected to a power source 3 through a switch 2. Two level detecting circuits 15 and 15' are respectively connected to corresponding juncture points J and J' of C, C' and R, R' of the two RC integrating circuits to detect the potentials at the respective juncture points J and J'.

The operation of the RC integrating circuits and the level detecting circuits will be explained. Assuming that the voltage across the terminals of each capacitor C and C' is zero when the power switch is opened, the potential at each juncture point J and J' rises as time passes after the switch 2 is closed.

Each of the level detecting circuits 15 and 15' detects respectively the potentials at each juncture point, and provides output signals at the corresponding output terminals PO and PO' when the potentials at the corresponding juncture points become equal to the respectively predetermined values. Therefore, I provide two predetermined constant time values required for the potentials at two juncture points J and J' to rise from zero to the respective predetermined constant levels.

However, if the power switch is opened before the potentials at two juncture points reach the corresponding constant levels, charges on the capacitors C and C' are held as they are so that the capacitors C, C' have some amount of residual charges on them at the moment the power switch 2 is closed again. As a result, a problem arises in that the time required to build the potential of the juncture points J and J' up to the predetermined level is shorter than the predetermined constant time, which is the time required for the terminal voltages of the capacitors C and C' to rise from zero up to the respective predetermined values.

This problem is solved by connecting respectively the terminals of the capacitors C and C' in shunt with the emitter and the collector of the corresponding transistors 10 and 10', as shown in FIG. 2.

With this configuration, when the power switch 2 is closed, the integrating circuits carry out the proper integration without affecting the transistors 10 and 10' which are now nonconductive, and the level detecting circuits 15 and 15' respectively detect when the potentials of the juncture points J and J' rise up to the respectively predetermined values and generate the output signals on the output terminals PO and PO' at that time.

When the power switch 2 is opened, as beforementioned, the transistors 10 and 10' become conductive, the capacitors C and C' are short circuited by the transistors 10 and 10' respectively, their terminal voltages drop to zero, and all of the circuit elements return to their initial state. Therefore, if the power switch 2 is closed again, the level detecting circuits detect the time required for the potentials of the juncture points J and J' to rise up to the predetermined levels without any error since the integrating circuits start from their initial state, each of the juncture points J and J' being at zero level.

Figure 3:
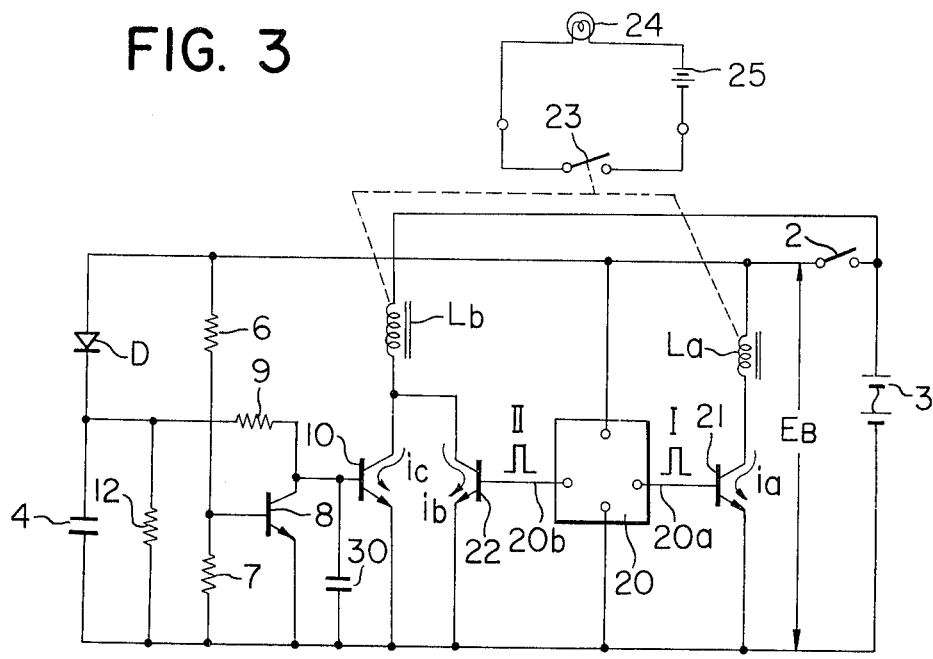
FIG. 3 is a wiring diagram of a latching relay circuit applying the same embodiment of the present invention.

FIG. 3 shows the second embodiment of this invention which includes a latching relay.

A pulse signal generator 20, which produces pulse signals alternately on its two output terminals 20a and 20b, is connected to a power source 3 in series with a power switch 2.

The collector electrodes of transistors 21 and 22 are respectively connected to their corresponding coils La and Lb, their base electrodes are respectively connected to the output terminals 20a and 20b of the pulse signal generator 20, and their emitter electrodes to a negative terminal of the power source 3.

The coil La is connected to a positive terminal of the power source 3 in series with the switch 2 and the coil Lb is directly connected to the same positive terminal of the source 3.

When the output signals I and II respectively on the output terminals 20a and 20b are supplied to the corresponding transistors 21 and 22, the transistors are turned on and pulse currents $ia$ and $ib$ flow through the coils La and Lb.

An electric contact 23 is closed when the pulse current $ia$ passes through the coil La, and is held in the same position by magnetic or mechanical means till the other pulse current $ib$ flows through the coil Lb, at which time the contact 23 is opened, and the same remains opened until the current $ia$ flows through the coil La again.

The pulse signal generator 20, the transistors 21 and 22, coils La and Lb and the contact 23 as explained above constitute a latching relay.

In operation, if the power switch 1 is closed, the boltage $Eb$ of the power source 3 is applied to the circuit shown in FIG. 3. (See waveform $a$ in FIG. 4). The pulse signal generator 20 alternately provides the signals I or II shown in waveforms $b$ and $c$ of FIG. 4, and the contact 23 is opened or closed as shown in waveform d of FIG. 4.

Figure 4:
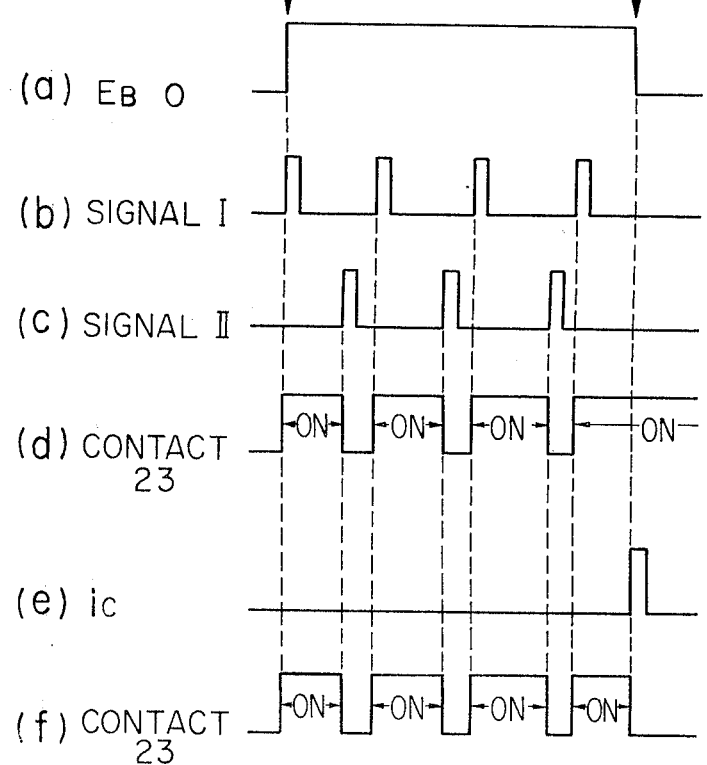
FIG. 4 is a waveform diagram useful to explain the operation of the circuit shown in FIG. 3.

Assuming that the power switch 2 is opened after the signal I was supplied as seen in the waveform a of FIG. 4, the contact 23 is kept closed since the signal II is no longer supplied.

Therefore, if the contact 23 is connected in series with a lamp 24 and a power source 25, the lamp 24 is kept lighted and the power source 25 is wasted.

In the above case, it is desired that the contact 23 of the relay is opened whenever the power switch 2 is opened. This invention can be used for this purpose.

The transistor 1 and the resistor 5 are used for the purpose of preventing reverse current in the embodiment of FIG. 1. Instead of that, a diode D is connected between the power switch 2 and the capacitor 4 and a collector electrode of a transistor 10 is connected to a juncture point of the coil L$b$ and the collector electrode of the transistor 22 for the same purpose.

A capacitor 30 is also connected in shunt between the base and the emitter electrodes of the transistor 10 in order to prevent the malfunction of this circuit and to decrease the consumption of the contact caused by chattering of the power switch 2.

The remaining configurations of the circuit are the same as those shown in FIG. 1.

In accordance with the circuit in FIG. 3, the transistor 10 is turned on for a predetermined time interval to cause the current $ic$ to flow through the coil L$b$ because the terminal voltage of the capacitor 4 is applied to the transistor 10 even if the power switch 2 is opened after the signal I was impressed (see waveform $e$ in FIG. 4).

Therefore, the contact 23 is opened and kept opened thereafter (see waveform $f$ in FIG. 4).

After the predetermined time interval, the transistor 10 turns off and all circuit elements of this circuit are brought back to a non-operative situation.

The transistor 8 shown in FIG. 1 through FIG. 3, which is turned on in order to effect a short circuit between the base and the emitter electrodes of the transistor 10 when the power switch 2 is closed, can be replaced with a mechanical switch that is linked with the power switch 2 to be opened or closed respectively in accordance with opening or closing of the latter.

Figure 5:
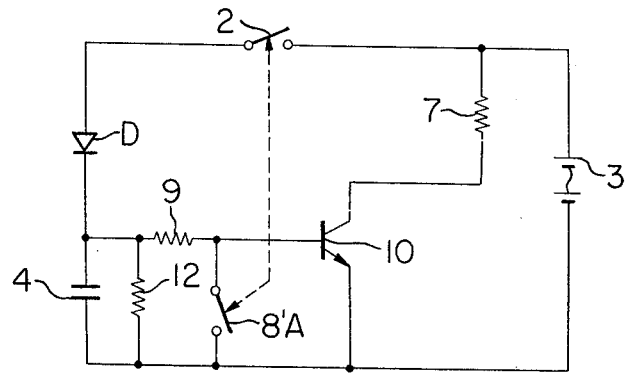
FIG. 5 is an electric circuit diagram of the second illustrative embodiment of the present invention.
Figure 6:
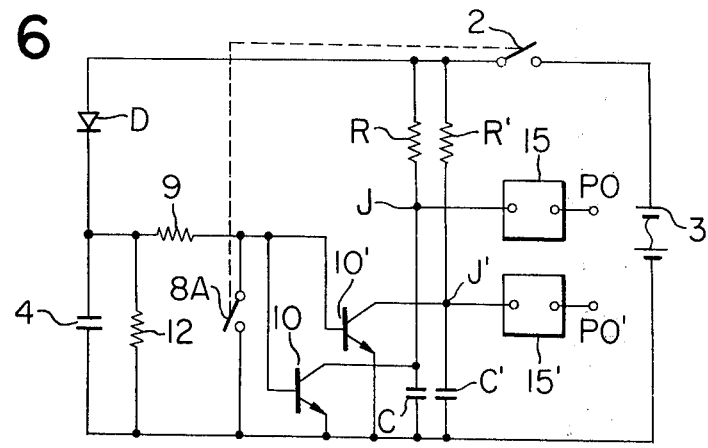
FIG. 6 is an electric circuit diagram of a RC integrating circuit applying the second embodiment of the present invention.
Figure 7:
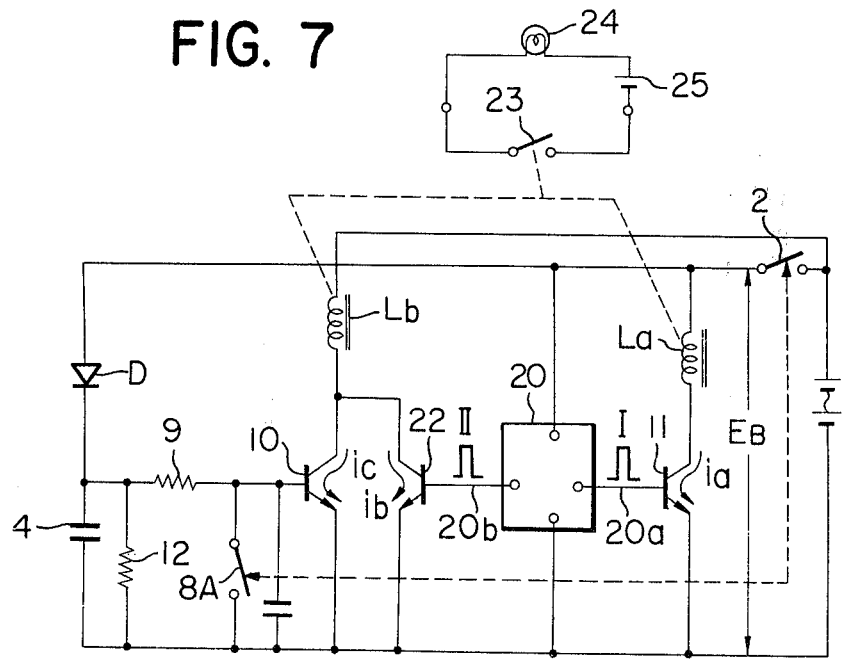
FIG. 7 is a wiring diagram of a latching relay circuit applying the second embodiment of the present invention.

Embodiments in which the transistor 8 has been replaced with the mechanical switch 8A are shown in FIG. 5, FIG. 6 and FIG. 7.

The operation of the circuits in these Figures is the same as in the FIG. 1 through FIG. 3. The embodiments shown in FIG. 2 and FIG. 6 teach that a linked switch is enough to reset plural circuits at the same time in accordance with this present invention.

Figure 8:
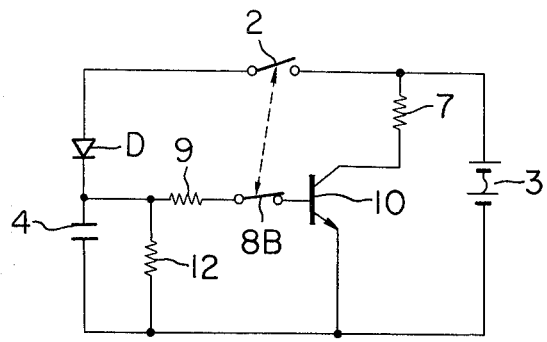
FIGS. 8 through 10 shown respectively the third through the fifth embodiments of the present invention.

As shown in FIG. 8, a switch 8B is connected between a resistor 9 and the base of a first transistor and is linked with a power switch 2 in order to be opened or closed respectively in accordance with closing or opening of the power switch 2. By this configuration, it is also possible that the first transistor is switched on since a voltage across the terminals of a first capacitor is applied between the base and the emitter electrodes of the first transistor through the resistor 9 and the switch 8B.

Figure 9:
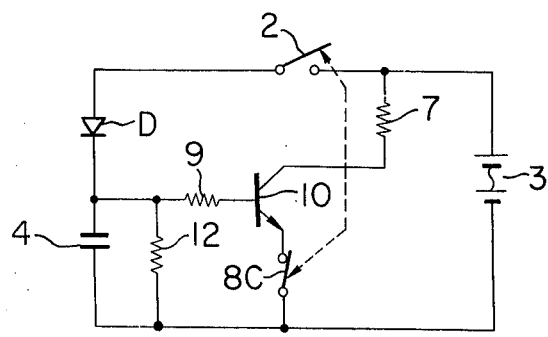
Figure 10:
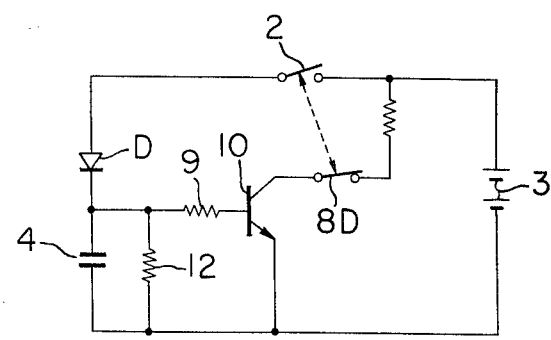

Furthermore, the switch can be connected in the emitter circuit or the collector circuit of the first transistor instead of its base circuit to generate a signal for a predetermined period after the power switch 2 is opened. These modifications are shown respectively in FIG. 9 and FIG. 10.

From the foregoing description, it will be seen that I contribute a circuit according to which a generating signal is established for a predetermined period after a power switch is turned off, and it can be automatically terminated without a switch or with only one switch linked with the power switch.

I believe that the construction and operation of my novel circuit will now be understood and that the advantages thereof will be fully appreciated by those persons skilled in the art.

I claim:

1. A circuit for generating a signal for a predetermined time interval after a power switch is opened, comprising a power switch, a capacitor coupled to be charged by current from a power source only when said power switch is closed, a transistor having a control electrode, and having a pair of principal conducting electrodes, means for applying a terminal voltage of said capacitor to said transistor control electrode to render said transistor conductive for a predetermined time interval after said power switch is opened, and a latching relay having first and second coils, having switch means biased in a first switch position when the first coil is energized and biased in a second switch position when the second coil is energized, and having means for supplying current alternately to the first and the second coils when the power switch is closed, wherein said second coil is connected in series with said principal conducting electrodes of said transistor and supplied with current through said transistor when the power switch is opened.

2. A circuit for generating a signal for a predetermined time interval after a power switch is opened comprising
  a power switch;
  a capacitor connected to be charged only during the time said power switch is closed;
  a first transistor;
  circuit means for applying a terminal voltage of said capacitor to said first transistor to render it conductive for a predetermined time interval after said power switch is opened; and
  a latching relay including a first coil, a second coil, switch means biased in one condition when said first coil is energized and biased in another condition when said second coil is energized, means for supplying current alternately to said first and said second coils when said power switch is closed, and means coupling said first transistor to energize one of said coils when said first transistor is rendered conductive.

3. A circuit according to claim 2, wherein said circuit means includes switch means for rendering said first transistor non-conductive when said power switch is closed.

4. A circuit according to claim 3, wherein said switch means is a second transistor connected between the base and the emitter of said first transistor, and further comprising means connected to render said second transistor conductive when said power switch is closed.

5. A circuit according to claim 3, wherein said switch means is a ganged switch linked with said power switch.

6. A circuit according to claim 3, wherein said means for supplying current to said coils includes a pair of coildriving transistors connected respectively in series with said first and second coils, and means for controlling said coildriving transistors to conduct alternately when said power switch is closed, said first transistor being connected in parallel with one of said coil-driving transistors.

* * * * *

UNITED STATES PATENT OFFICE
CERTIFICATE OF CORRECTION

Patent No. 3,934,178     Dated January 20, 1976

Inventor(s) OSAMU MAIDA

It is certified that error appears in the above-identified patent and that said Letters Patent are hereby corrected as shown below:

Column 4, line 64, change "boltage" to -- voltage --.

Column 6, line 63, change "claim 3" to -- claim 2 --.

Signed and Sealed this twenty-seventh Day of April 1976

[SEAL]

Attest:

RUTH C. MASON
*Attesting Officer*

C. MARSHALL DANN
*Commissioner of Patents and Trademarks*